(12) United States Patent
Hamada et al.

(10) Patent No.: US 6,555,253 B2
(45) Date of Patent: Apr. 29, 2003

(54) ORGANIC ELECTROLUMINESCENT DEVICE

(75) Inventors: Yuji Hamada, Nara (JP); Masayuki Shono, Hirakata (JP); Yasuhiko Matsushita, Tottori (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 09/331,775

(22) PCT Filed: Apr. 30, 1998

(86) PCT No.: PCT/JP98/01999

§ 371 (c)(1),
(2), (4) Date: Jun. 24, 1999

(87) PCT Pub. No.: WO98/51131

PCT Pub. Date: Nov. 12, 1998

(65) Prior Publication Data

US 2002/0081453 A1 Jun. 27, 2002

(30) Foreign Application Priority Data

May 8, 1997 (JP) ............................................. 9-118337
Nov. 17, 1997 (JP) ............................................. 9-315245
Nov. 17, 1997 (JP) ............................................. 9-315262

(51) Int. Cl.[7] .............................................. H05B 33/14
(52) U.S. Cl. ........................ 428/690; 428/691; 428/917; 313/503; 313/504; 313/505; 313/506; 257/40; 257/103; 252/301.35
(58) Field of Search ............................... 428/690, 691, 428/917; 313/503, 504, 505, 506; 257/40, 103; 252/301.35

(56) References Cited

U.S. PATENT DOCUMENTS 4,634,639 A * 1/1987 Kawai ........................ 428/690
5,432,014 A    7/1995 Sano et al.
5,484,922 A * 1/1996 Moore et al. .................. 546/7
5,747,183 A * 5/1998 Shi et al. ..................... 428/690

FOREIGN PATENT DOCUMENTS

| EP | 0 579 151 | 10/1996 |
| JP | 3-297090 | 12/1991 |
| JP | 5-101885 | 4/1993 |
| JP | 6-172751 | 6/1994 |
| JP | 6-331973 | 12/1994 |
| JP | 7-252475 | 10/1995 |
| JP | 8-111286 | 4/1996 |
| JP | 9-102628 | 4/1997 |

OTHER PUBLICATIONS

S. A. Van Slyke et al., Blue Organic Light Emitting Devices, EL 96 Berlin, Aug. 1996, pp. 195–200.

H. J. Wagner et al., "Purification and characterization of phthalocyanines," Journal of Materials Science 17, 1982, pp. 2781–2791. No month.

Y. Yamamoto et al. Bull. Chem. Soc. Japan, vol. 53, No. 3 (1980) pp. 809–810. See PCT search rpt. No month.

* cited by examiner

Primary Examiner—Deborah Jones
Assistant Examiner—Ling Xu
(74) Attorney, Agent, or Firm—Armstrong, Westerman & Hattori, LLP (57) ABSTRACT

In an organic electroluminescent device constructed by providing at least an emitting layer and a carrier transport layer using an organic material between a hole injection electrode and an electron injection electrode, at least one of the emitting layer and the carrier transport layer contains a chelate compound of a chromone derivative with zinc or aluminum, a chelate compound of a 3-hydroxyflavone derivative with a metal, a chelate compound composed of an 8-quinolinol derivative dimer and another ligant which are coordinated to a metal, or a chelate compound composed of two 8-quinolinol derivatives coordinated to a metal and one halogen bonded thereto.

7 Claims, 6 Drawing Sheets

ORGANIC ELECTROLUMINESCENT DEVICE

TECHNICAL FIELD

The present invention relates generally to an organic electroluminescent device constructed by providing at least an emitting layer and a carrier transport layer using an organic material between a hole injection electrode and an electron injection electrode, and more particularly, to an organic electroluminescent device capable of performing stable luminance for a long time by using an organic material composed of a stable chelate compound as the organic material in the emitting layer and the carrier transport layer to prevent the organic material from being crystallized in the emitting layer and the carrier transport layer.

BACKGROUND ART

In recent years, the needs of flat panel display devices in the consumption of electric power and the size of which are smaller than those of a CRT (Cathode Ray Tube) which has been heretofore generally employed have been increased as information equipments are diversified, for example. An electroluminescent device has been paid attention to as one of the flat panel display devices.

The electroluminescent device is roughly divided into an inorganic electroluminescent device and an organic electroluminescent device depending on a used material.

The inorganic electroluminescent device is so adapted that a high electric field is generally applied on a luminescent portion, and electrons are accelerated within the high electric field to collide with a luminescence center, whereby the luminescence center is excited to emit light. On the other hand, the organic electroluminescent device is so adapted that electrons and holes are respectively injected into a luminescent portion from an electron injection electrode and a hole injection electrode, the electrons and the holes thus injected are recombined with each other in a luminescence center to bring an organic molecule into its excited state, and the organic molecule emits fluorescence when it is returned from the excited state to its ground state.

In the case of the inorganic electroluminescent device, a high voltage of 100 to 200 volts is required as its driving voltage because the high electric field is exerted as described above. On the other hand, the organic electroluminescent derive can be driven at a low voltage of approximately 5 to 20 volts.

In the case of the organic electroluminescent device, a luminescent device emitting light in a suitable color can be obtained by selecting a fluorescent material that is a luminescent material. It is expected that the organic electroluminescent device can be also utilized as a multi-color or full-color display device, for example. Further, it is considered that the organic electroluminescent device is utilized as a back light of a liquid crystal display device or the like because it can emit light at a low voltage.

In recent years, various studies have been conducted on such an organic electroluminescent device.

In such an organic electroluminescent device, an emitting layer and a carrier transport layer which is constituted by a hole transport layer for transporting holes to the emitting layer and an electron transport layer for transporting electrons thereto are generally provided between a hole injection electrode and an electron injection electrode. Specifically, used as the structure thereof are a three-layer structure referred to as a DH structure obtained by laminating a hole transport layer, an emitting layer and an electron transport layer between a hole injection electrode and an electron injection electrode, a two-layer structure referred to as an SH-A structure obtained by laminating a hole transport layer and an emitting layer abundant in electron transporting properties between a hole injection electrode and an electron injection electrode, and a two-layer structure referred to as an SH-B structure obtained by laminating an emitting layer abundant in hole transporting properties and an electron transport layer between a hole injection electrode and an electron injection electrode.

In forming the carrier transport layer and the emitting layer in the organic electroluminescent device, various types of organic materials have been conventionally used, to form uniform layers composed of the organic material generally by vacuum evaporation or the like.

However, the organic material generally used for the emitting layer and the carrier transport layer has not conventionally shown sufficient stability. The organic material is gradually crystallized with the elapse of time, so that crystals are deposited on the emitting layer and the carrier transport layer. Consequently, there are some problems. For example, the organic electroluminescent device is short-circuited, for example, so that the overall organic electroluminescent device cannot uniformly emit light.

Conventionally, a chelate compound composed of a plurality of ligands coordinated to one metal ion, for example, tris(8-quinolinol)aluminum (hereinafter referred to as $Alq_3$) indicated by the following chemical formula 1 has been widely utilized as the organic material in the emitting layer and the carrier transport layer.

(Chemical Formula 1)

$Alq_3$

However, the chelate compound heretofore widely utilized does not necessarily have sufficient properties. In the case of the above-mentioned $Alq_3$, for example, its luminescent peak wavelength is as large as 520 nm to 530 nm, and its excitation energy is small. When the $Alq_3$ is used as a host material in the emitting layer, there are some problems. For example, a dopant such as perylene having large excitation energy cannot be caused to emit light.

A conventional organic electroluminescent device is so constructed that a hole injection electrode composed of an indium-tin oxide (hereinafter referred to as ITO) having a large work function is provided on a transparent glass substrate, to take out light emitted in the emitting layer outward through the hole injection electrode and the glass substrate.

Since the refractive indices of the emitting layer and the ITO are generally 1.5 to 1.7, and the refractive index of the glass substrate is also generally about 1.5, while the refractive index of air is 1.0, however, a part of the light emitted in the emitting layer is reflected on the interface of the glass substrate and the air, to be confined in the organic electroluminescent device. Therefore, the luminance of the light irradiated outward is reduced.

Furthermore, in the conventional organic electroluminescent device, the electron injection electrode is generally formed of a metal having a small work function in order that electrons are efficiently injected into the organic electroluminescent device from the electron injection electrode.

When the electron injection electrode is formed of a metal having a small work function, however, the electron injection electrode is easily oxidized upon reacting with oxygen and water in the air. When the electron injection electrode is thus oxidized, properties in the electron injection electrode are degraded, so that there are some problems. For example, the luminance is reduced, and dark spots (non-luminescent portions) grow.

An object of the present invention is to solve the above-mentioned various problems in an organic electroluminescent device having at least an emitting layer and a carrier transport layer using an organic material between a hole injection electrode and an electron injection electrode.

That is, an object of the present invention is to prevent, in the above-mentioned organic electroluminescent device, an organic material used for an emitting layer and a carrier transport layer from being gradually crystallized with the elapse of time as in the conventional example, to prevent short, for example, of the organic electroluminescent device.

An object in the organic electroluminescent device according to the present invention is to make it possible to perform stable luminance for a long time by using an organic material composed of a stable chelate compound for the emitting layer and the carrier transport layer.

An object in the organic electroluminescent device according to the present invention is to make it possible to sufficiently cause, even in a case where an organic material composed of a new chelate compound is used for the emitting layer and the carrier transport layer, and a dopant such as perylene having large excitation energy is used, the dopant to emit light.

An object in the organic electroluminescent device according to the present invention is to make it possible to efficiently emit light emitted in the emitting layer outward through a glass substrate.

Furthermore, an object in the organic electroluminescent device according to the present invention is to make it possible to perform stable luminance by preventing an electron injection electrode from being oxidized.

DISCLOSURE OF THE INVENTION

In an organic electroluminescent device constructed by providing at least an emitting layer and a carrier transport layer using an organic material between a hole injection electrode and an electron injection electrode, a first organic electroluminescent device according to the present invention is characterized in that at least one of the emitting layer and the carrier transport layer contains a chelate compound of a chromone derivative with zinc or aluminum.

When a chelate compound of a chromone derivative with zinc or aluminum is used as the organic material in the emitting layer and the carrier transport layer as in the first organic electroluminescent device, the chelate compound is stable and is difficult to crystallize, thereby preventing crystals from being deposited on the emitting layer and the carrier transport layer, to prevent short, for example, of the first organic electroluminescent device. Therefore, stable luminance is performed for a long time.

In an organic electroluminescent device constructed by providing at least a carrier transport layer and an emitting layer using an organic material between a hole injection electrode and an electron injection electrode, a second organic electroluminescent device according to the present invention is characterized in that at least one of the emitting layer and the carrier transport layer contains a chelate compound of a 3-hydroxyflavone derivative with a metal.

When a chelate compound of a 3-hydroxyflavone derivative with a metal is used as the organic material in the emitting layer and the carrier transport layer as in the second organic electroluminescent device, the chelate compound is stable and is difficult to crystallize, thereby preventing crystals from being deposited on the emitting layer and the carrier transport layer, to prevent short, for example, of the second organic electroluminescent device. Therefore, stable luminance is performed for a long time.

In an organic electroluminescent device constructed by providing at least an emitting layer and a carrier transport layer using an organic material between a hole injection electrode and an electron injection electrode, a third organic electroluminescent device according to the present invention is characterized in that at least one of the emitting layer and the carrier transport layer contains a chelate compound composed of an 8-quinolinol derivative dimer coordinated to a metal.

In a case where a chelate compound composed of an 8-quinolinol derivative dimer coordinated to a metal is used as in the third organic electroluminescent device according to the present invention, when the chelate compound is heated in a vacuum state, the chelate compound sublimates, so that an evaporation film is easily formed. Therefore, the emitting layer and the carrier transport layer are simply formed. Further, even when the emitting layer and the carrier transport layer are left under high temperatures after the evaporation film is thus formed, crystals are prevented from being deposited on the emitting layer and the carrier transport layer. Therefore, stable luminance can be performed for a long time.

In an organic electroluminescent device constructed by providing at least an emitting layer and a carrier transport layer using an organic material between a hole injection electrode and an electron injection electrode, a fourth organic electroluminescent device according to the present invention is characterized in that at least one of the emitting layer and the carrier transport layer contains a chelate compound composed of two 8-quinolinol derivatives coordinated to a metal and one halogen bonded thereto.

Three-dimensional distortion of the chelate compound used in the fourth organic electroluminescent device according to the present invention is larger than that of the chelate compound conventionally generally used. When the chelate compound is used for the emitting layer, therefore, its luminescent peak wavelength is shifted toward the shorter wavelength, so that its excitation energy is increased.

When the chelate compound is used as a luminescent material in the emitting layer, therefore, light having a short wavelength is emitted. On the other hand, when the chelate compound is used as a host material in the emitting layer, a dopant having large excitation energy can be caused to emit light. Further, when the chelate compound is used as the host material, and a particular dopant is used, the chelate compound and the dopant form an exciplex. Consequently, the half value width of a luminescent spectrum is increased, so that light different from the light emitted by the dopant and the chelate compound is emitted.

In the present invention, a reflection preventing film for reducing the reflectance is formed on a surface, from which light is emitted, of a glass substrate for emitting light emitted in the emitting layer in each of the above-mentioned first to fourth organic electroluminescent devices.

When the reflection preventing film for reducing the reflectance is formed on the surface, from which light is emitted, of the glass substrate as in the organic electroluminescent device, the light emitted in the emitting layer is efficiently emitted through the glass substrate.

In the present invention, an oxidation preventing protective film is formed on the surface of the electron injection electrode in each of the above-mentioned first to fourth organic electroluminescent devices by ECR (Electron Cyclotron Resonance) plasma CVD (Chemical Vapor Deposition).

When the above-mentioned oxidation preventing protective film is formed on the surface of the electron injection electrode as in the organic electroluminescent device, the electron injection electrode is prevented from being oxidized, thereby preventing the luminance from being reduced and preventing dark spots from growing. As described above, according to the ECR plasma CVD, an oxidation preventing protective film can be formed under low temperatures, and the oxidation preventing protective film can be formed at a high speed of not less than 100 nm/min. Therefore, the oxidation preventing protective film can be efficiently formed without adversely affecting the organic material in the organic electroluminescent device.

BEST MODE FOR CARRYING OUT THE INVENTION

Description is now made of an organic electroluminescent device according to an embodiment of the present invention on the basis of the accompanying drawings.

Figure 1:
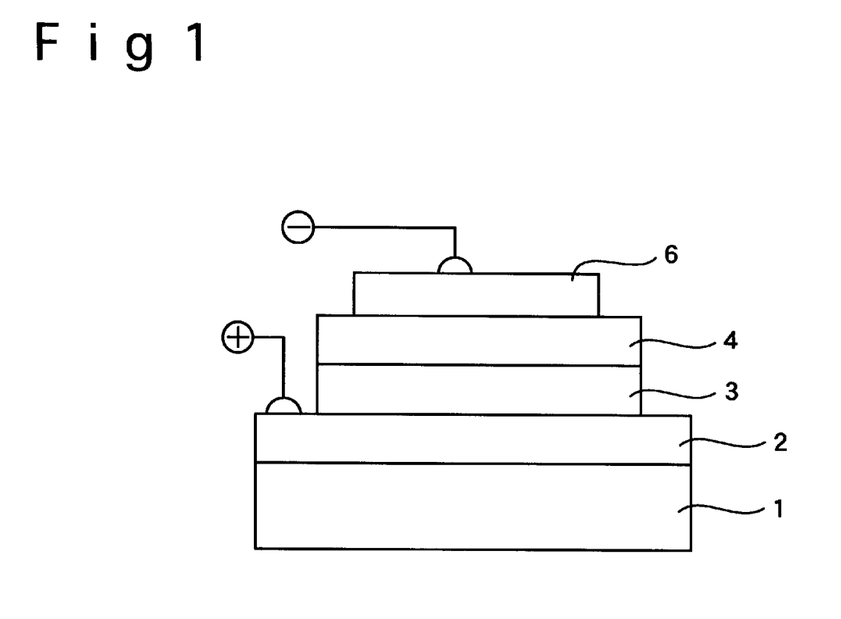
FIG. 1 is a schematic explanatory view showing an embodiment of an organic electroluminescent device according to the present invention, that is, an organic electroluminescent device having an SH-A structure obtained by laminating a hole transport layer and an emitting layer between a hole injection electrode and an electron injection electrode.
Figure 2:
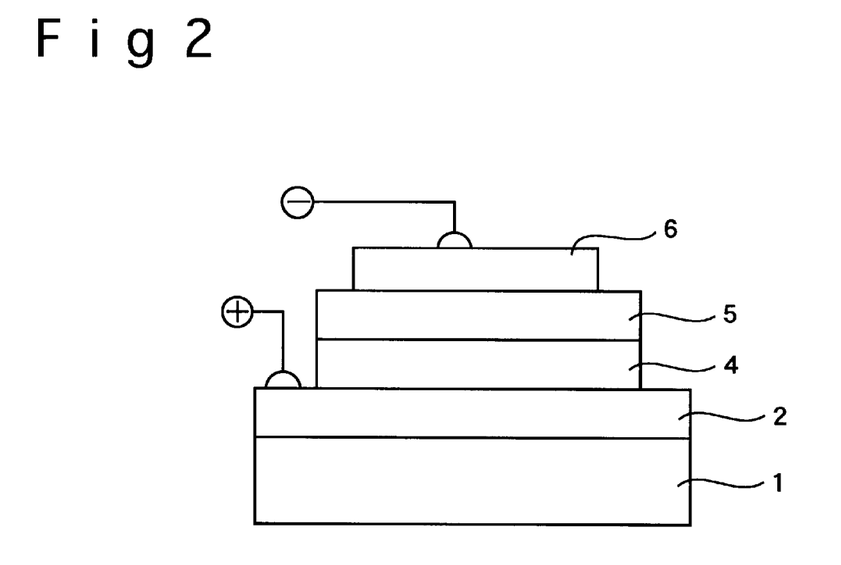
FIG. 2 is a schematic explanatory view showing an embodiment of an organic electroluminescent device according to the present invention, that is, an organic electroluminescent device having an SH-B structure obtained by laminating an emitting layer and an electron transport layer between a hole injection electrode and an electron injection electrode.
Figure 3:
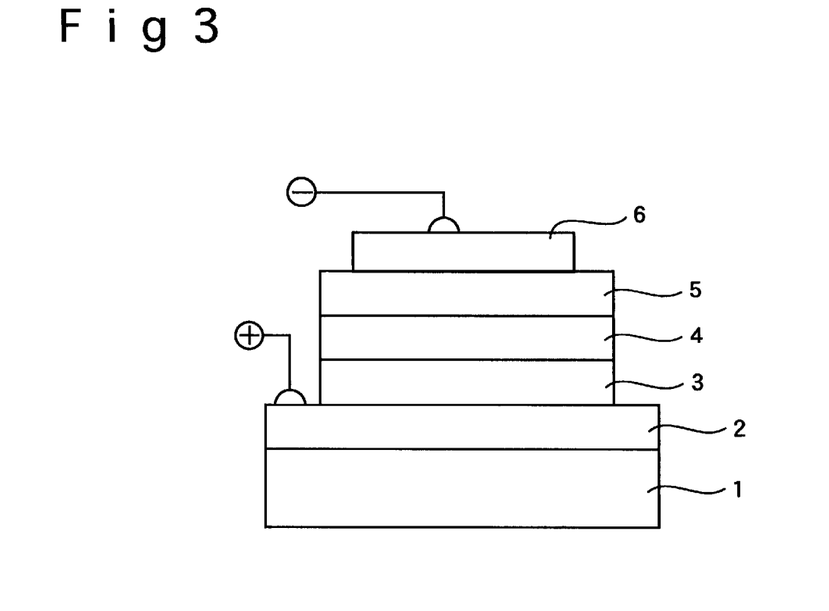
FIG. 3 is a schematic explanatory view showing an embodiment of an organic electroluminescent device according to the present invention, that is, an organic electroluminescent device having a DH structure obtained by laminating a hole transport layer, an emitting layer and an electron transport layer between a hole injection electrode and an electron injection electrode.

It is possible to use, as the structure of the organic electronic luminescent device in the present invention, an SH-A structure obtained by laminating a hole transport layer 3 and an emitting layer 4 between a hole injection electrode 2 and an electron injection electrode 6, as shown in FIG. 1, an SH-B structure obtained by laminating an emitting layer 4 and an electron transport layer 5 between a hole injection electrode 2 and an electron injection electrode 6, as shown in FIG. 2, a DH structure obtained by laminating a hole transport layer 3, an emitting layer 4, and an electron transport layer 5 between a hole injection electrode 2 and an electron injection electrode 6, as shown in FIG. 3, and a structure in which the hole transport layer in the organic electroluminescent device having the DH structure shown in FIG. 3 is constituted by a first hole transport layer $3a$ and a second hole transport layer $3b$.

In the above-mentioned organic electroluminescent device, a material having a large work function, for example, gold or ITO is used as a material composing the hole injection electrode 2, while an electrode material having a small work function, for example, magnesium is used as a material composing the electron injection electrode 6. In order to extract light emitted in the emitting layer 4 outward, at least one of the hole injection electrode 2 and the electron injection electrode 6 must be made transparent. The hole injection electrode 2 is generally composed of ITO which is transparent and has a large work function.

In a first organic electroluminescent device according to the present invention, a chelate compound of a chromone derivative with zinc or aluminum is used as a luminescent material and a host material in the emitting layer 4 and an electron transporting material in the electron transport layer 5, as described above.

It is possible to use, as the above-mentioned chromone derivative, a chromone derivative in which hydrogen in its 5-position is replaced by a hydroxyl group, and $R_1$ and $R_2$ in its 2-position and 3-position are composed of hydrogen, an alkyl group ($—C_nH_{2n+1}$: n=1 to 10), a phenyl group, an aryl group, an amino group, a cyano group, an alkoxy group ($—OC_nH_{2n+1}$: n=1 to 10), a halogen, etc, as indicated by the following chemical formula 2. Particularly when a derivative of 2-phenyl-5-hydroxychromone in which hydrogen in its 2-position in the chemical formula 1 is replaced by a phenyl group, as indicated by the following chemical formula 3, that is, 5-hydroxyflavone (5Fla) is used as the above-mentioned chromone derivative, and a chelate compound of the 5-hydroxyflavone derivative with zinc or aluminum is used as the luminescent material in the emitting layer, a high luminance is obtained.

(Chemical formula 2)

(Chemical formula 3)

In the second organic electroluminescent device according to the present invention, a chelate compound of a 3-hydroxyflavone derivative with a metal is used as the luminescent material and the host material in the emitting layer 4 or the electron transporting material in the electron transport layer 5, as described above.

It is possible to use, as the 3-hydroxyflavone (3Fla) derivative, one in which $R_3$, $R_4$, $R_5$, and $R_6$ in its 5-position, 6-position, 7-position, and 8-position are composed of hydrogen, an alkyl group (—$OC_nH_{2n+1}$: n=1 to 10), a phenyl group, an aryl group, an amino group, a cyano group, an alkoxy group (—$OC_nH_{2n+1}$, n=1 to 10), a halogen, etc, as indicated by the following chemical formula 4:

(Chemical formula 4)

On the other hand, it is possible to use, as metals composing the 3-hydroxyflavone derivative and the chelate compound, group II metals in the periodic table, for example, Zn and Be, and group III metals in the periodic table, for example, Al.

In a third organic electroluminescent device according to the present invention, a chelate compound composed of an 8-quinolinol derivative dimer coordinated to a metal is used as the luminescent material and the host material in the emitting layer 4 or the electron transporting material in the electron transport layer 5, as described above.

It is possible to use, as the chelate compound composed of an 8-quinolinol derivative dimer coordinated to a metal, one composed of an 8-quinolinol derivative dimer coordinated to a group II metal $M_2$ in the periodic table or one composed of an 8-quinolinol derivative dimer and another ligand which are coordinated to a group III metal in the periodic table, for example, a chelate compound as indicated by the following chemical formula 5:

(Chemical formula 5)

In the chemical formula 5, $M_2$ is a group II metal in the periodic table. $R_7$ is a group selected from —$N(C_nH_{2n+1})$—, —$C_{n+1}H_{2n+2}$—, —$CH=N$—$(C_nH_{2n})$—$N=CH$—, —$CH_2$—$NH$—$(C_nH_{2n})$—$NH$—$CH_2$—, o-phenylene, and o-naphthylene, and n is an integer of 1 to 10. $R_8$ is not particularly limited.

In a fourth organic electroluminescent device according to the present invention, a chelate compound composed of two 8-quinolinol derivatives coordinated to a metal and one halogen bonded thereto is used as the luminescent material and the host material in the emitting layer 4 or the electron transporting material in the electron transport layer 5, as described above.

An example of the chelate compound composed of two 8-quinolinol derivatives coordinated to a metal and one halogen bonded thereto is one indicated by the following chemical formula 6:

(Chemical formula 6)

In the chelate compound indicated by the foregoing chemical formula 6, a metal selected from Al, Ga, and In which are group III metals in the periodic table is used as the metal $M_3$, and superior properties are obtained particularly when Ga is used as the metal $M_3$.

On the other hand, in the 8-quinolinol derivative coordinated to the metal $M_3$, a substituent group selected from —$C_nH_{2n+1}$, —$N(C_n2H_{n+1})$, —$O(C_nH_{2n+1})$, —$COO(C_nH_{2n+1})$, —CN, —F, —Cl, —Br, —I, and an aromatic group may be used. Alternatively, $R_9$ may be a group, together with the 8-quinolinol derivative, forming an aromatic ring. n is an integer of 0 to 10.

The above-mentioned X is a halogen, for example, F, Cl, Br, and I.

Particularly in order that a chelate compound composed of two 8-quinolinol derivatives coordinated to the metal $M_3$ and one halogen X bonded thereto is formed, as indicated by the foregoing chemical formula 6, it is preferable that a substituent group $R_9$ is provided in the 2-position and the 7-position of the 8-quinolinol derivative, and the substituent group $R_9$ provides a steric hindrance in a case where the 8-quinolinol derivative is coordinated to the metal $M_3$, to prevent three 8-quinolinol derivatives from being coordinated to the metal $M_3$.

It is possible to use, as the substituent group $R_9$ which is thus replaced by the 2-position or the 7-position of the 8-quinolinol derivative, a methyl group, an ethyl group, or a propyl group, for example. When the chelate compound is used as the luminescent material, it is preferable that a methyl group is used as the substituent group $R_9$ in order to obtain a sufficient luminance.

Figure 5:
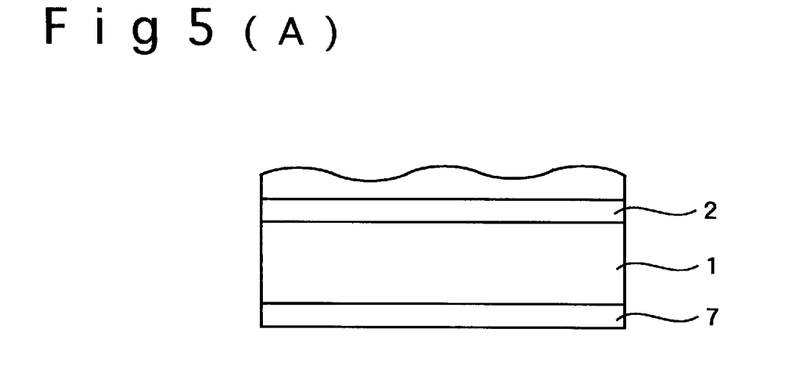
FIG. 5 is a partial explanatory view showing a state where a reflection preventing film is formed on a surface, from which light is emitted, of a glass substrate in the organic electroluminescent device according to the present invention.

In each of the first to fourth organic electroluminescent devices according to the present invention, it is preferable that a reflection preventing film 7 for reducing the reflectance is formed on a surface, from which light is emitted, of a glass substrate 1 for emitting light emitted in the emitting layer outward so that the light emitted in the emitting layer is efficiently emitted through the glass substrate 1, as shown in FIG. 5 (A).

Various types of inorganic compounds such as $SiO_2$, $TiO_2$, and $ZrO_2$ can be used as a material composing the reflection preventing film 7.

In providing the reflection preventing film 7, it is preferable that a plurality of films 7a, 7b, 7c, and 7d composed of inorganic compounds which differ in refractive index are laminated, to form the reflection preventing film 7, as shown in FIG. 5(B). When the plurality of films 7a, 7b, 7c, and 7d composed of the inorganic compounds which differ in refractive index are thus laminated, the thickness of each of the films 7a, 7b, 7c, and 7d composed of the inorganic compounds must be suitably adjusted in consideration of the refractive index n of each of the inorganic compounds and the luminescent wavelength λ of the organic electroluminescent device. For example, a first $TiO_2$ film 7a having a thickness of λ/2n, a first $SiO_2$ film 7b having a thickness of λ/2n, a second $TiO_2$ film 7c having a thickness of λ/2n, and a second $SiO_2$ film 7d having a thickness of λ/4n are provided on the glass substrate 1. After the films 7a, 7b, and 7c composed of the inorganic compounds having a thickness of λ/2n are formed, as described above, when the film 7d composed of the inorganic compound having a thickness of λ/4n is provided, the phase of light is reversed, to obtain a low reflective film. The above-mentioned films 7a to 7d composed of the inorganic compounds can be produced by electron beam evaporation or sputtering.

Figure 6:
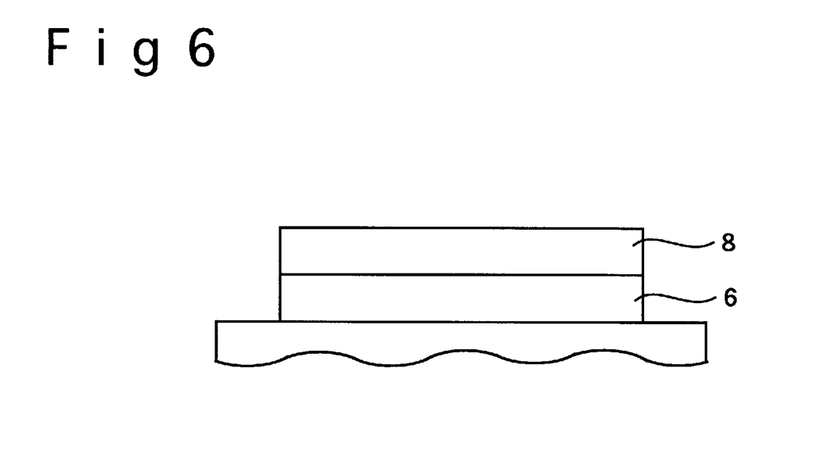
FIG. 6 is a partial explanatory view showing a state where an oxidation preventing protective film is formed on an electron injection electrode in the organic electroluminescent device according to the present invention.

In each of the organic electroluminescent devices according to the present invention, it is preferable that an oxidation preventing protective film 7 is formed on the surface of the electron injection electrode 6 by ECR plasma CVD, to prevent the electron injection electrode 6 from being oxidized, as shown in FIG. 6.

It is possible to use, as an example of a material composing the oxidation preventing protective film 7, silicon nitride $Si_3N_4$, an amorphous diamond-like carbon containing a diamond bond and a graphite bond as a mixture, or the like.

When the oxidation preventing protective film 7 is composed of the above-mentioned nitride silicon, water and oxygen are reliably prevented from entering from the exterior by the oxidation preventing protective film 7 composed of the nitride silicon because the structure of the nitride silicon is minuter than that of silicon oxide $SiO_2$. Therefore, the electron injection electrode 6 is prevented from being oxidized. When the oxidation preventing protective film 7 is composed of the above-mentioned diamond-like carbon, it can be presumed that the diamond-like carbon has a three-dimensional network structure mainly containing a ring consisting of six carbons and also containing a ring consisting of five carbons, a ring consisting of seven carbons, and other rings. The property thereof is similar to the property of diamond which is high in hardness, is chemically inert, is transparent to visible light to infrared light, and is high in electrical resistance. Therefore, water and oxygen are reliably prevented from entering from the exterior by the oxidation preventing protective film 7 composed of the diamond-like carbon, so that the electron injection electrode 6 is prevented from being oxidized.

Figure 7:
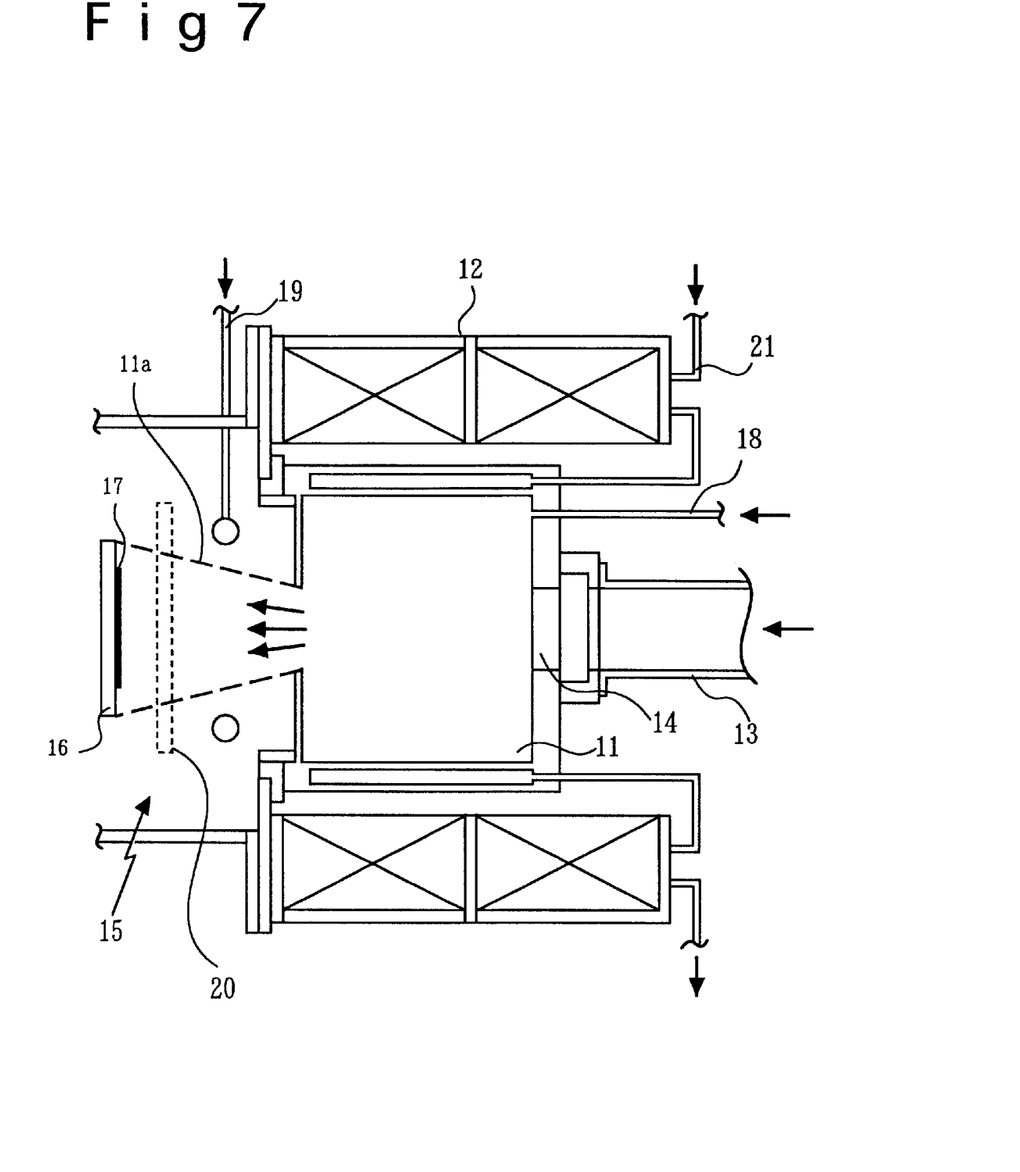
FIG. 7 is a schematic view of an ECR plasma CVD apparatus used for forming an oxidation preventing protective film on an electron injection electrode.

An ECR plasma CVD apparatus used for forming the oxidation preventing protective film 7 will be specifically described on the basis of FIG. 7.

In the ECR plasma CVD apparatus, a plasma chamber 11 is a hollow resonator, and a magnetic coil 12 is arranged around the plasma chamber 11. The plasma chamber 11 is cooled by supplying cooling water to a cooling pipe 21. A microwave generated by a magnetron (not shown) is conveyed through a rectangular waveguide 13, and the microwave enters the plasma chamber 11 through a quartz glass plate 14. On the other hand, gas such as nitrogen $N_2$, oxygen $O_2$, or argon Ar is supplied to the plasma chamber 11 from a gas supply pipe 18. The gas is changed into a plasma current 11a, and the plasma current is supplied to a deposition chamber 15. A sample 17 is arranged with it being held in a sample holder 16 in the deposition chamber 15, and raw material gas supplied from a gas supply pipe 19 is decomposed, so that a film is formed on the sample 17. A shutter 20 is arranged between the sample 17 and the plasma chamber 11.

When the above-mentioned ECR plasma CVD apparatus is used, the oxidation preventing protective film 8 composed of the nitride silicon $Si_3N_4$ or the diamond-like carbon can be formed under low temperatures, so that the organic material in the organic electroluminescent device is not adversely affected, and the oxidation preventing protective film 8 can be efficiently formed in a short time.

A metal layer made of a material different from that of the electron injection electrode 6 may be provided between the oxidation preventing protective film 7 and the electron injection electrode 6, and an electrode can be also taken out by the metal layer.

Description is now made of specific examples of each of the first to fourth organic electroluminescent devices according to the present invention.

EXAMPLE 1

In an organic electroluminescent device in this example 1, $Zn(5Fla)_2$ indicated by the following chemical formula 7 which is a chelate compound of 5-hydroxyflavone indicated by the foregoing chemical formula 3 with zinc was used as a luminescent material used for an emitting layer 4.

(Chemical formula 7)

Zn(5Fla)₂

In synthesizing the Zn(5Fla)₂, 0.5 g (2.10 mmol) of the 5-hydroxyflavone was dissolved in methanol while being heated. On the other hand, 0.23 g (1.05 mmol) of a 2 hydrate of zinc acetate was dissolved in methanol using another chamber, and a solution of the 2 hydrate of zinc acetate was dropped in a solution of the 5-hydroxyflavone, was subjected to reflux for about ten minutes, to obtain a yellow deposit, and was then further subjected to reflux in air for three hours.

After being sucked, filtered, and dried, the deposit was purified by a sublimating and purifying apparatus using a train sublimation method [H. J. Wagner, R. O. Loutfy, and C. K. Hsiao; J. Mater. Sci. Vol. 17, P2781 (1982)], to obtain the above-mentioned Zn(5Fla)₂.

In this example 1, a transparent hole injection electrode 2 having a thickness of 2000 Å composed of ITO was formed on a glass substrate 1, and a hole transport layer 3 having a thickness of 500 Å composed of N, N-diphenyl-N, N'-bis (3-methylphenyl)-1,1'-diphenyl-4,4'-diamine (hereinafter referred to as TPD) indicated by the following chemical formula 8 and an emitting layer 4 having a thickness of 500 Å composed of Zn(5Fla)₂ synthesized in the above-mentioned manner, and an electron injection electrode 6 having a thickness of 2000 Å composed of a magnesium-indium alloy were laminated on the hole injection electrode 2, as shown in FIG. 1, to obtain an organic electroluminescent device having an SH-A structure:

(Chemical formula 8)

TPD

A method of fabricating the organic electroluminescent device in the example 1 will be specifically described. The glass substrate 1 having the hole injection electrode 2 composed of ITO formed on its surface was first cleaned by a neutral detergent, was ultrasonically cleaned in acetone and ethanol, respectively, for 20 minutes and 20 minutes, and was further put in boiling ethanol for about one minute and taken out, and was then immediately dried by ventilation.

The above-mentioned TPD was then vacuum evaporated over the hole injection electrode 2 formed on the glass substrate 1, to form the hole transport layer 3, and the above-mentioned Zn(5Fla)₂ was then vacuum evaporated over the hole transport layer 3, to form the emitting layer 4. Further, a magnesium-indium alloy was vacuum evaporated over the emitting layer 4, to form the electron injection electrode 6. The vacuum evaporation was performed without controlling the substrate temperature at a degree of vacuum of $1 \times 10^{-6}$ Torr.

When a positive voltage and a negative voltage were respectively applied to the hole injection electrode 2 and the electron injection electrode 6 in the organic electroluminescent device in the example 1, yellow light having a high luminance, the maximum of which was 890 cd/m² at a voltage of 9 volts, having a luminescent peak wavelength of 591 nm, and having values of 0.473 and 0.516 as x and y chromaticity coordinates was emitted by the Zn(5Fla)₂.

EXAMPLE 2

An organic electroluminescent device in this example 2 was fabricated in the same manner as the organic electroluminescent device in the above-mentioned example 1 except that Al (5Fla)₃ which is a chelate compound of the above-mentioned 5-hydroxyflavone with aluminum and is indicated by the following chemical formula 9 was used as a luminescent material used for an emitting layer 4.

(Chemical formula 9)

Al(5Fla)₃

When a positive voltage and a negative voltage were respectively applied to a hole injection electrode 2 and an electron injection electrode 6 in the organic electroluminescent device in the example 2, yellow light having a high luminance, the maximum of which was 1280 cd/m² at a voltage of 10 volts, having a luminescent peak wavelength of 598 nm, and having values of 0.467 and 0.521 as x and y chromaticity coordinates was emitted by the Al(5Fla)₃.

EXAMPLE 3

An organic electroluminescent device in this example 3 was fabricated in the same manner as the organic electroluminescent device in the above-mentioned example 1 except that Zn(3Fla)$_2$ which is a chelate compound of 3-hdroxyflavone (3Fla) with zinc and is indicated by the following chemical formula 10 was used as a luminescent material used for an emitting layer 4.

(Chemical formula 10)

Zn(3Fl$_a$)$_2$

When a positive voltage and a negative voltage were respectively applied to a hole injection electrode 2 and an electron injection electrode 6 in the organic electroluminescent device in the example 3, orange light having a high luminance, the maximum of which was 200 cd/m$^2$ at a voltage of 12 volts, having a luminescent peak wavelength of 610 nm, and having values of 0.474 and 0.476 as x and y chromaticity coordinates was emitted by the Zn(3Fla)$_2$.

EXAMPLE 4

In an organic electroluminescent device in this example 4, the Zn(5Fla)$_2$ which is the chelate compound indicated by the foregoing chemical formula 7 was used as an electron transporting material in an electron transport layer 5.

In this example 4, a transparent hole injection electrode 2 having a thickness of 2000 Å composed of ITO was formed on a glass substrate 1, and a hole transport layer 3 having a thickness of 500 Å composed of a triphenyl amine derivative (hereinafter referred to as MTDATA) indicated by the following chemical formula 11, an emitting layer 4 having a thickness of 200 Å obtained by doping 5% by weight of rubrene indicated by the following chemical formula 13 into a host material composed of αNPD indicated by the following chemical formula 12, an electron transport layer 5 having a thickness of 500 Å composed of the above-mentioned Zn(5Fla)$_2$, and an electron injection electrode 6 having a thickness of 2000 Å composed of a magnesium-indium alloy in which the ratio of magnesium to indium is 10:1 were laminated on the hole injection electrode 2, as shown in FIG. 3, to obtain an organic electroluminescent device having a DH structure.

(chemical formula 11)

MTDATA (Chemical formula 12)

αNPD (Chemical formula 13)

Rubrene

When a positive voltage and a negative voltage were respectively applied to the hole injection electrode 2 and the electron injection electrode 6 in the organic electroluminescent device in the example 4, yellow light having a high luminance, the maximum of which was 3500 cd/m$^2$ at a voltage of 10 volts, having a luminescent peak wavelength of 559 nm, and having values of 0.484 and 0.540 as x and y chromaticity coordinates was emitted by the rubrene.

When the organic electroluminescent device in the example 4 was sealed and was left in drying air, no crystal was deposited in the electron transport layer 5 even after half a year, so that luminescent properties were hardly degraded.

EXAMPLE 5

An organic electroluminescent device in this example 5 was fabricated in the same manner as the organic electroluminescent device in the above-mentioned example 4 except that the chelate compound Al(5Fla)$_3$ indicated by the foregoing chemical formula 9 was used as an electron transporting material in an electron transport layer 5.

When a positive voltage and a negative voltage were respectively applied to a hole injection electrode 2 and an electron injection electrode 6 in the organic electroluminescent device in the example 5, yellow light having a high luminance, the maximum of which was 5600 cd/m² at a voltage of 10 volts, having a luminescent peak wavelength of 559 nm, and having values of 0.484 and 0.540 as x and y chromaticity coordinates was emitted by the rubrene.

When the organic electroluminescent device in the example 5 was sealed and was left in drying air, no crystal was deposited in the electron transport layer 5 even after half a year, so that luminescent properties were hardly degraded.

EXAMPLE 6

In an organic electroluminescent device in this example 6, N-methyl-2,2'-iminobis(8-hydroxyquinolinate) zinc complex (hereinafter referred to as ZnMIBQ) indicated by the following chemical formula 14 was used as a luminescent material.

(Chemical formula 14)

ZnMIBQ

In synthesizing the ZnMIBQ, 1.0 g (3.15 mmol) of N-methyl-2,2'-iminobis (8-quinolinol) was dissolved in methanol while being moistened. On the other hand, 0.69 g (3.15 mmol) of a 2 hydrate of zinc acetate was dissolved in methanol using another chamber, and a solution of the 2 hydrate of zinc acetate was dropped in a solution of the N-methyl-2, 2'-iminobis(8-quinolinol), and was subjected to reflux in air for about one hour, to obtain a yellow deposit.

After being sucked, filtered, and dried, the deposit was purified by a sublimating and purifying apparatus using a train sublimation method [H. J. Wagner, R. O. Loutfy, and C. K. Hsiao; J. Mater. Sci. Vol. 17, P2781 (1982)], to obtain the above-mentioned ZnMIBQ.

In this example 6, a transparent hole injection electrode 2 composed of ITO was formed on a glass substrate 1, and a hole transport layer 3 having a thickness of 500 Å composed of the TPD indicated by the foregoing chemical formula 8, an emitting layer 4 having a thickness of 500 Å composed of the ZnMIBQ indicated by the foregoing chemical formula 14, and an electron injection electrode 6 having a thickness of 2000 Å composed of a magnesium-indium alloy (Mg:In= 10:1) were laminated on the hole injection electrode 2, as shown in FIG. 1, to obtain an organic electroluminescent device having the above-mentioned SH-A structure.

A method of fabricating the organic electroluminescent device in the example 6 will be specifically described. The glass substrate 1 having the hole injection electrode 2 composed of ITO formed on its surface was first cleaned by a neutral detergent, was ultrasonically cleaned in acetone and ethanol, respectively, for 20 minutes and 20 minutes, was further put in boiling ethanol for about one minute and taken out, and was then immediately dried by ventilation.

The above-mentioned TPD was then vacuum evaporated over the hole injection electrode 2 formed on the glass substrate 1, to form the hole transport layer 3, and the above-mentioned ZnMIBQ was then vacuum evaporated over the hole transport layer 3, to form the emitting layer 4. Further, the magnesium-indium alloy was vacuum evaporated over the emitting layer 4, to form the electron injection electrode 6. The vacuum evaporation was performed without controlling the substrate temperature at a degree of vacuum of 6×10⁻⁶ Torr.

When a positive voltage and a negative voltage were respectively applied to the hole injection electrode 2 and the electron injection electrode 6 in the organic electroluminescent device in the example 6, yellow light having a high luminance, the maximum of which was 1000 cd/m² at a voltage of 10 volts, having a luminescent peak wavelength of 579 nm, and having values of 0.455 and 0.523 as x and y chromaticity coordinates was emitted by the above-mentioned ZnMIBQ.

EXAMPLE 7

In this example 7, an organic electroluminescent device having an SH-A structure was obtained in the same manner as the organic electroluminescent device in the above-mentioned example 6 except that an emitting layer 4 was formed using ZnMIBQ, while the αNPD indicated by the foregoing chemical formula 12 was used in place of the above-mentioned TPD.

COMPARATIVE EXAMPLE 1

In this comparative example 1, an organic electroluminescent device having an SH-A structure was obtained in the same manner as the organic electroluminescent device in the above-mentioned example 7 except that in forming an emitting layer 4, Zn(BOX)₂ indicated by the following chemical formula 15 was used in place of the above-mentioned ZnMIBQ.

(Chemical formula 15)

Zn(BOX)₂

When a positive voltage and a negative voltage were respectively applied to a hole injection electrode 2 and an electron injection electrode 6 in the organic electroluminescent device in the example 7, yellow light having a luminance of 1100 cd/m² at a voltage of 12 volts and having a luminescent peak wavelength of 579 nm was emitted by the above-mentioned ZnMIBQ.

When a positive voltage and a negative voltage were respectively applied to a hole injection electrode 2 and an electron injection electrode 6 in the organic electroluminescent device in the comparative example 1, blue light having a luminance of 1040 cd/m² at a voltage of 13 volts and having a luminescent peak wavelength of 446 nm was emitted by the above-mentioned Zn(BOX)₂.

When each of the organic electroluminescent devices in the example 7 and the comparative example 1 was sealed with resin and was left under an atmosphere of 80° C. for 200 hours, after which the organic electroluminescent device was caused to emit light in the above-mentioned manner, the luminance of the organic electroluminescent device in the comparative example 1 was reduced by approximately 20%, while the same luminance as initial luminance was obtained in the organic electroluminescent device in the example 7.

The reason for this is that the above-mentioned ZnMIBQ which is a luminescent material used in the organic electroluminescent device in the example 7 was superior in heat resistance than the Zn(BOX)$_2$ which is a luminescent material used in the organic electroluminescent device in the comparative example 1.

When the above-mentioned ZnMIBQ used as the luminescent materials in the examples 6 and 7 and the TPD indicated by the foregoing chemical formula 8 generally used in the organic electroluminescent device were respectively evaporated over a glass substrate, and were left in air at room temperature for one month, no crystal was deposited in an evaporation film composed of the ZnMIBQ, while crystals were deposited in the whole of an evaporation film composed of the TPD. Therefore, it was found that the film formation stability of the ZnMIBQ was superior to that of the TPD.

EXAMPLE 8

In this example 8, a transparent hole injection electrode 2 composed of ITO was formed on a glass substrate 1, and a hole transport layer 3 having a thickness of 500 Å composed of the MTDATA indicated by the foregoing chemical formula 11, an emitting layer 4 having a thickness of 200 Å obtained by doping 5% by weight of the rubrene indicated by the foregoing chemical formula 13 into a host material composed of the TPD indicated by the foregoing chemical formula 8, an electron transport layer 5 having a thickness of 400 Å composed of the ZnMIBQ indicated by the foregoing chemical formula 14, and an electron injection electrode 6 having a thickness of 2000 Å composed of a magnesium-indium alloy (Mg:In=10:1) were laminated on the hole injection electrode 2, as shown in FIG. 3, to obtain an organic electroluminescent device having a DH structure.

When a positive voltage and a negative voltage were respectively applied to the hole injection electrode 2 and the electron injection electrode 6 in the organic electroluminescent device in the example 8, yellow light having a luminance of 4500 cd/m$^2$ at a voltage of 12 volts, having a luminescent peak wavelength of 560 nm, and having values of 0.232 and 0.611 as x and y chromaticity coordinates was emitted by the above-mentioned rubrene. As a result, it was found that the above-mentioned ZnMIBQ also effectively acted as an electron transporting material.

EXAMPLE 9

In this example 9, an organic electroluminescent device having an SH-A structure was obtained in the same manner as the organic electroluminescent device in the above-mentioned example 6 except that AlQ(MIBQ) indicated by the following chemical formula 16 was used in place of the above-mentioned ZnMIBQ as a luminescent material used for the emitting layer 4.

(Chemical formula 16)

AlQ(MIBQ)

When a positive voltage and a negative voltage were respectively applied to a hole injection electrode 2 and an electron injection electrode 6 in the organic electroluminescent device in the example 9, yellow green light having a luminance of 500 cd/m$^2$ at a voltage of 13 volts and having a luminescent peak wavelength of 550 nm was emitted by the above-mentioned AlQ(MIBQ).

EXAMPLE 10

In an organic electroluminescent device in this example 10, GaMq$_2$Cl indicated by the following chemical formula 17 was used as a luminescent material.

(Chemical formula 17)

GaMq$_2$Cl

In synthesizing the GaMq$_2$Cl, 1.97 g (11.2 mmol) of gallium chloride GaCl$_3$ was added to 300 ml of a Mayer flask, and was dissolved in 100 ml of water. On the other hand, 3.57 g (22.4 mmol) of 2-methyl-8-quinolinol was added to 300 ml of another Meyer flask, and was dissolved in 50 ml of ethanol, and a solution of the 2-methyl-8-quinolinol was added to a solution of the gallium chloride, and was mixed therewith, to obtain a yellow white deposit.

After being sucked, filtered, and then dried, the deposit was further purified by a sublimating and purifying apparatus using a train sublimation method [H. J. Wagner, R. O. Loutfy, and C. K. Hsiao; J. Mater. Sci. Vol. 17, P2781 (1982)], and the purified deposit was subjected to elementary analysis. As a result, measured values of the proportions of C, H, and N almost coincided with calculated values of GaMq$_2$Cl, as shown in the following Table 1.

TABLE 1

| | C | H | N |
|---|---|---|---|
| calculated value (%) | 56.99 | 3.83 | 6.69 |
| measured value (%) | 56.57 | 3.84 | 6.65 |

The molecular weight of the above-mentioned purified deposit was measured using a mass spectrum. In measuring the molecular weight of the purified deposit using the mass spectrum, 0.1 to 0.5 g of powder of the purified deposit was dissolved in 5 ml of chloroform, a mass spectrum analyzer (M-80A: manufactured by Hitachi, Ltd.) was used, and an electric field elimination ionization method was used for ionizing molecules, to measure the molecular weight under measurement conditions such as a chamber voltage of 3 kV, an emitter current of 0 to 40 mA, a scan range of 0 to 1000, a scan rate of 8 seconds, and a gain of 1.5 kV. The results thereof were shown in FIG. 8.

Figure 8:
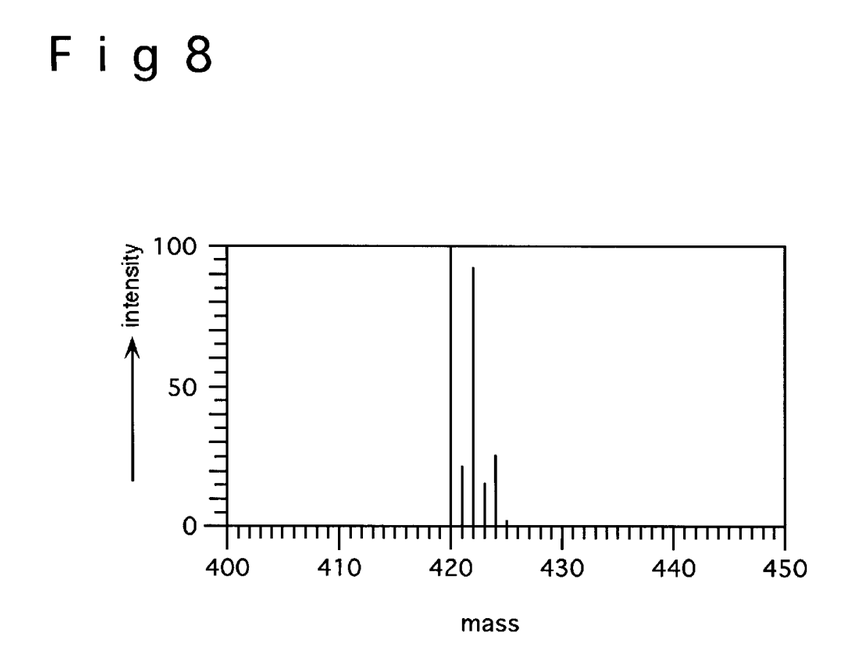
FIG. 8 is a diagram showing the results of measurement using a mass spectrum of $GaMq_2Cl$ used as a luminescent material in an organic electroluminescent device shown in an example 10 of the present invention.
Figure 9:
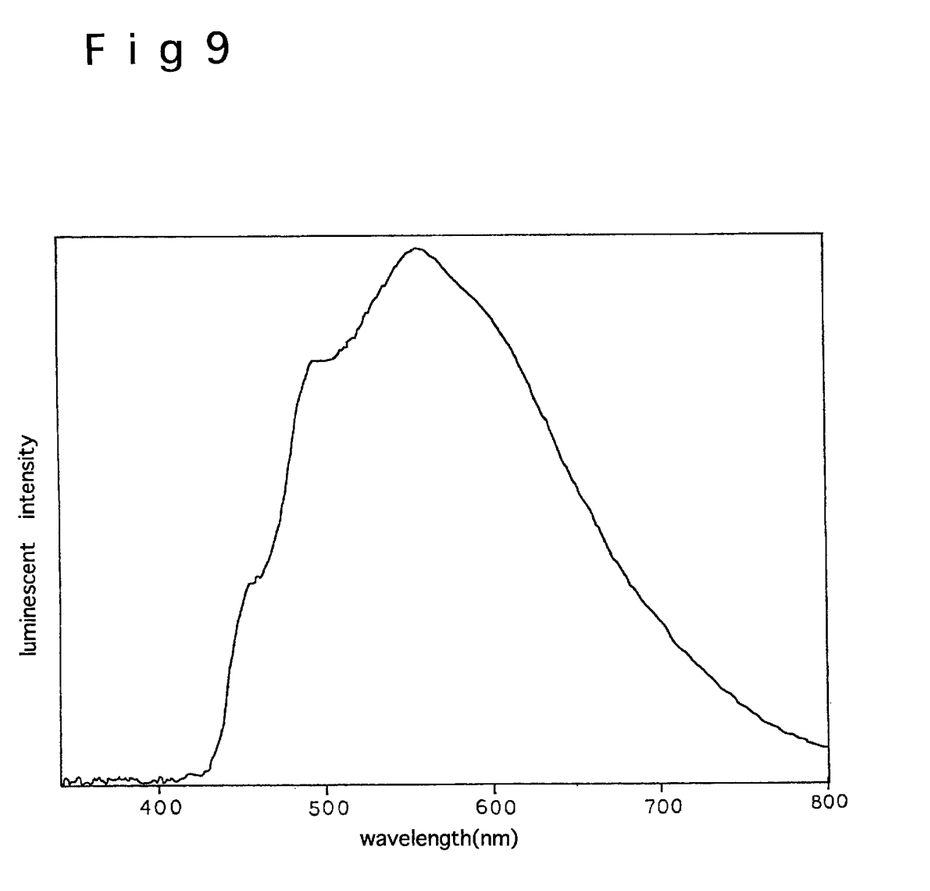
FIG. 9 is a diagram showing the state of a luminescent spectrum in an organic electroluminescent device in an example 11 of the present invention.

As a result, ions having a value of m/e: 420 corresponding to ions of GaMq$_2$Cl were observed, so that it was confirmed that the above-mentioned purified deposit was GaMq$_2$Cl. Since isotopes were respectively included at a predetermined ratio in Ga and Cl, respective patterns of the isotopes were also observed.

In this example 10, a transparent hole injection electrode 2 composed of ITO was formed on a glass substrate 1, and a hole transport layer 3 having a thickness of 500 Å composed of the TPD indicated by the foregoing chemical formula 8, an emitting layer 4 having a thickness of 500 Å composed of the GaMq$_2$Cl indicated by the foregoing chemical formula 17, and an electron injection electrode 6 having a thickness of 2000 Å composed of a magnesium-indium alloy (Mg:In=10:1) were laminated on the hole injection electrode 2, as shown in FIG. 1, to obtain an organic electroluminescent device having an SH-A structure.

A method of fabricating the organic electroluminescent device in the example 10 will be specifically described. The glass substrate 1 having the hole injection electrode 2 composed of ITO formed on its surface was first cleaned by a neutral detergent, was ultrasonically cleaned in acetone and ethanol, respectively, for 20 minutes and 20 minutes, was further put in boiling ethanol for about one minute and taken out, and was then immediately dried by ventilation.

The above-mentioned TPD was then vacuum evaporated over the hole injection electrode 2 formed on the glass substrate 1, to form the hole transport layer 3, and the above-mentioned GaMq$_2$Cl was then vacuum evaporated over the hole transport layer 3, to form the emitting layer 4. Further, a magnesium-indium alloy was vacuum evaporated over the emitting layer 4, to form the electron injection electrode 6. The vacuum evaporation was performed without controlling the substrate temperature at a degree of vacuum of 6×10$^{-6}$ Torr.

When a positive voltage and a negative voltage were respectively applied to the hole injection electrode 2 and the electron injection electrode 6 in the organic electroluminescent device in the example 10, green light having a high luminance of 10490 cd/m$^2$ at a voltage of 9 volts and having values of 0.281 and 0.487 as x and y chromaticity coordinates was emitted by the above-mentioned GaMq$_2$Cl.

EXAMPLE 11

Figure 4:
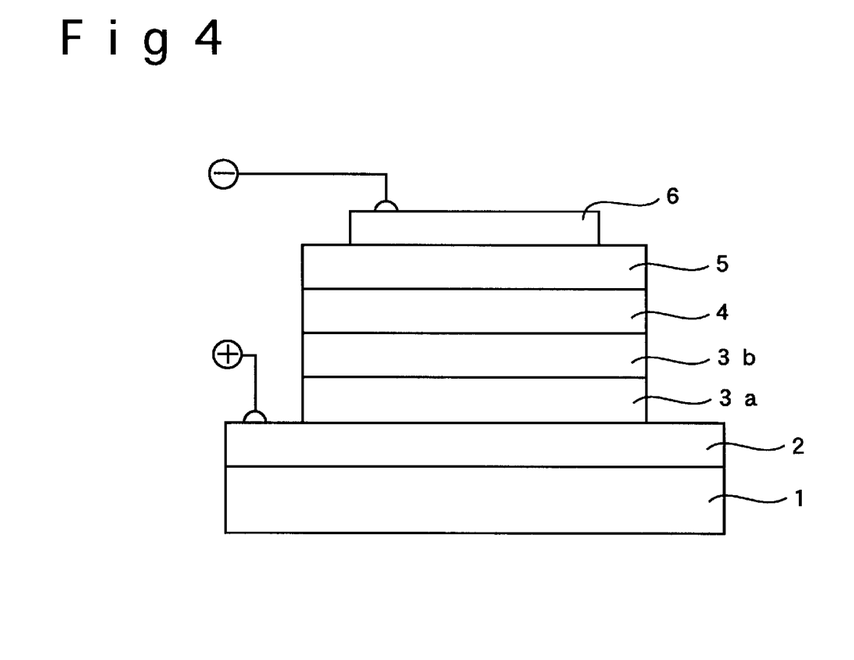
FIG. 4 is a schematic explanatory view showing an embodiment of an organic electroluminescent device according to the present invention, that is, an organic electroluminescent device in which a hole transport layer in the organic electroluminescent device having the DH structure shown in FIG. 3 is constituted by a first hole transport layer and a second transport layer.

In an organic electroluminescent device in this example 11, a transparent hole injection electrode 2 composed of ITO was formed on a glass substrate 1, and a first hole transport layer 3a having a thickness of 400 Å composed of the MTDATA indicated by the foregoing chemical formula 11, a second hole transport layer 3b having a thickness of 100 Å composed of the TPD indicated by the foregoing chemical formula 8, an emitting layer 4 having a thickness of 200 Å obtained by doping 3% by weight of perylene indicated by the following chemical formula 18 into a host material composed of the GaMq$_2$Cl indicated by the foregoing chemical formula 17, an electron transport layer 5 having a thickness of 400 Å composed of bis (10-hydroxybenzo[h]-quinolinate)beryllium (hereinafter referred to as BeBq$_2$) indicated by the following chemical formula 19, and an electron injection electrode 6 having a thickness of 2000 Å composed of a magnesium-indium alloy (Mg:In=10:1) were laminated on the hole injection electrode 2 by vacuum evaporation, as shown in FIG. 4.

(Chemical formula 18)

perylene (Chemical formula 19)

BeBq$_2$

When a positive voltage and a negative voltage were respectively applied to the hole injection electrode 2 and the electron injection electrode 6 in the organic electroluminescent device in the example 11, white light having a luminance of 4500 cd/m$^2$ at a voltage of 10 volts and having values of 0.300 and 0.385 as x and y chromaticity coordinates was emitted. A luminescent spectrum was shown in FIG. 6.

The reason why in the organic electroluminescent device which was provided with the emitting layer 4 having perylene doped into the host material composed of the GaMq$_2$Cl as described above, not blue light emitted by the perylene but white light was emitted is that the perylene and the GaMq$_2$Cl which is the host material form an exciplex, so that the half value width of the luminescent spectrum was increased.

EXAMPLE 12

An organic electroluminescent device in this example 12 was obtained in the same manner as the organic electroluminescent device in the above-mentioned example 11 except that in forming an emitting layer 4, 1% by weight of coumarin 6 indicated by the following chemical formula 20 was doped into a host material composed of the above-mentioned GaMq$_2$Cl.

(Chemical formula 20)

Coumarin6

When a positive voltage and a negative voltage were respectively applied to a hole injection electrode 2 and an electron injection electrode 6 in the organic electroluminescent device in the example 12, green light having a high luminance of 23000 cd/m² at a voltage of 10 volts and having values of 0.232 and 0.611 as x and y chromaticity coordinates was emitted by the coumarin 6. In the case of the organic electroluminescent device, it was found that the coumarin 6 which is a dopant and the GaMq$_2$Cl which is the host material did not form an exciplex.

EXAMPLE 13

In this example 13, a transparent hole injection electrode 2 composed of ITO was formed on a glass substrate 1, and a hole transport layer 3 having a thickness of 400 Å composed of the MTDATA indicated by the foregoing chemical formula 11, an emitting layer 4 having a thickness of 300 Å obtained by doping 5% by weight of the rubrene indicated by the foregoing chemical formula 13 into a host material composed of the αNPD indicated by the foregoing chemical formula 12, an electron transport layer 5 having a thickness of 400 Å. composed of the GaMq$_2$Cl indicated by the foregoing chemical formula 17, and an electron injection electrode 6 having a thickness of 2000 Å composed of a magnesium-indium alloy (Mg:In=10:1) were laminated on the hole injection electrode 2 by vacuum evaporation, as shown in FIG. 3, to obtain an organic electroluminescent device having a DH structure.

When a positive voltage and a negative voltage were respectively applied to the hole injection electrode 2 and the electron injection electrode 6 in the organic electroluminescent device in the example 13, yellow light having a high luminance of 27700 cd/M² at a voltage of 12 volts and having values of 0.232 and 0.611 as x and y chromaticity coordinates was emitted by the rubrene. As a result, it was found that the above-mentioned GaMq$_2$Cl also exhibited superior properties as an electron transporting material.

EXAMPLE 14

In an organic electroluminescent device in this example 14, InMq$_2$Cl indicated by the following chemical formula 21 was used as a luminescent material.

(Chemical formula 21)

InMq$_2$Cl

The InMq$_2$Cl was synthesized in the same manner as the above-mentioned GaMq$_2$Cl except that indium chloride InCL$_3$ was used in place of the gallium chloride GaCl$_3$ used in synthesizing the GaMq$_2$Cl in the above-mentioned example 10. The molecular weight of the InMq$_2$Cl was measured using elementary analysis and a mass spectrum, as in the above-mentioned example 10, to confirm that a purified deposit was InMq$_2$Cl.

The organic electroluminescent device in the example 14 was obtained in the same manner as that in the above-mentioned example 10 except that an emitting layer 4 was formed using the above-mentioned InMq$_2$Cl.

When a positive voltage and a negative voltage were respectively applied to a hole injection electrode 2 and an electron injection electrode 6 in the organic electroluminescent device in the example 14, yellow green light having a luminance of 1870 cd/m² at a voltage of 10 volts was emitted by the InMq$_2$Cl.

EXAMPLE 15

An organic electroluminescent device in this example 15 was obtained in the same manner as the organic electroluminescent device in the above-mentioned example 13 except that an electron transport layer 5 was formed using the above-mentioned InMq$_2$Cl.

When a positive voltage and a negative voltage were respectively applied to a hole injection electrode 2 and an electron injection electrode 6 in the organic electroluminescent device in the example 15, yellow light having a luminance of 4090 cd/m² at a voltage of 13 volts was emitted by rubrene. As a result, it was found that the above-mentioned InMq$_2$Cl also exhibited superior properties as an electorn transporting material, similarly to the above-mentioned GaMq$_2$Cl.

EXAMPLE 16

An organic electroluminescent device in this example 16 was obtained in the same manner as the organic electroluminescent device in the above-mentioned example 13 except that AlMq$_2$Cl indicated by the following chemical formula 22 was used as an electron transporting material in an electron transport layer 5.

(Chemical formula 22)

AlMq₂Cl

When a positive voltage and a negative voltage were respectively applied to a hole injection electrode 2 and an electron injection electrode 6 in the organic electroluminescent device in the example 16, yellow light having a luminance of 16500 cd/m² at a voltage of 13 volts and having values of 0.238 and 0.605 as x and y chromaticity coordinates was emitted by rubrene. As a result, it was found that the above-mentioned AlMq₂Cl also exhibited superior properties as an electron transporting material, similarly to the above-mentioned GaMq₂Cl and InMq₂Cl.

The organic electroluminescent device in the present invention is not limited to those in the above-mentioned examples, and can be embodied by being suitably changed in the range in which the gist thereof is not changed.

INDUSTRIAL APPLICABILITY

As described in detail above, as in the first to third organic electroluminescent devices according to the present invention, a chelate compound of a chromone derivative with zinc or aluminum, a chelate compound of a 3-hydroxyflavone derivative with a metal, and a chelate compound composed of 8-quinolinol or a dimer of its derivative coordinated to a metal are used as an organic material contained in at least one of the carrier transport layer and the emitting layer. Since the chelate compounds are stable and are difficult to crystallize, uniform and stable luminance can be performed for a long time without gradually crystallizing the organic material used for the emitting layer and the carrier transport layer and depositing crystals on the emitting layer and the carrier transport layer to short-circuit the organic electroluminescent device as in the conventional organic electroluminescent device.

As in the fourth organic electroluminescent device according to the present invention, a chelate compound composed of two 8-quinolinol derivatives coordinated to a metal and one halogen bonded thereto is used as the organic material contained in at least one of the carrier transport layer and the emitting layer. When the chelate compound is used as the host material in the emitting layer, a dopant having large excitation energy can be also caused to emit light. On the other hand, when the chelate compound is used as the host material, and a particular dopant is used, the chelate compound and the dopant form an exciplex, so that the half value width of the luminescent spectrum is increased, thereby emitting light different from the light emitted by the dopant and the chelate compound.

What is claimed is:

1. An organic electroluminescent device constructed by providing at least a carrier transport layer and an emitting layer using an organic material between a hole injection electrode and an electron injection electrode, characterized in that at least one of said emitting layer and said carrier transport layer contains a chelate compound composed of an 8-quinolinol derivative dimer coordinated to a metal.

2. The organic electroluminescent device according to claim 1, characterized in that a chelate compound indicated by the following chemical formula is used as said chelate compound:

wherein $M_2$ is a group II metal in the periodic table, $R_7$ is a group selected from $-N(C_nH_{2n+1})-$, $-C_{n+1}H_{2n+2}-$, $-CH=N-(C_nH_{2n})-N=CH-$, $-CH_2-NH-(C_nH_{2n})-NH=CH_2-$, o-phenylene, and o-naphthylene, where n is an integer of 0 to 10, and $R_8$ is not particularly limited.

3. The organic electroluminescent device according to claim 1, characterized in that the metal in said chelate compound is a group III metal in the periodic table, and a chelate compound composed of an 8-quinolinol derivative dimer and another ligand which are coordinated to the metal.

4. The organic electroluminescent device according to claim 1, characterized in that said chelate compound is used as a luminescent material or a host material in the emitting layer.

5. The organic electroluminescent device according to claim 1, characterized in that said chelate compound is used as an electron transporting material in the carrier transport layer.

6. The organic electroluminescent device according to claim 1, characterized in that a transparent substrate is provided on its surface from which light is emitted, and a reflection preventing film for reducing the reflectance is formed on a surface, from which light is emitted, of the transparent substrate.

7. The organic electroluminescent device according to claim 1, characterized in that an oxidation preventing protective film composed of a diamond-like carbon is formed on the surface of said electron injection electrode by ECR plasma CVD.

* * * * *